United States Patent [19]
Matsushita et al.

[11] 4,063,275
[45] Dec. 13, 1977

[54] SEMICONDUCTOR DEVICE WITH TWO PASSIVATING LAYERS

[75] Inventors: Takeshi Matsushita, Sagamihara; Hisao Hayashi, Atsugi; Teruaki Aoki, Tokyo; Hidenobu Mochizuki, Atsugi, all of Japan

[73] Assignee: Sony Corporation, Tokyo, Japan

[21] Appl. No.: 624,889

[22] Filed: Oct. 22, 1975

[30] Foreign Application Priority Data

Oct. 26, 1974   Japan ................ 49-123765

[51] Int. Cl.$^2$ .................. H01L 29/04; H01L 23/30
[52] U.S. Cl. .................................... 357/54; 357/59
[58] Field of Search ............. 357/54, 52, 59; 427/93, 427/94, 95

[56] References Cited
U.S. PATENT DOCUMENTS

| 3,419,746 | 12/1968 | Crowell et al. | 357/31 |
| 3,440,477 | 4/1969 | Crowell et al. | 357/31 |
| 3,558,348 | 1/1971 | Rand | 357/52 |
| 3,615,913 | 10/1971 | Shaw | 357/52 |
| 3,649,884 | 3/1972 | Haneta | 357/54 |
| 3,649,886 | 3/1972 | Kooi | 357/54 |
| 3,878,549 | 4/1975 | Yamazaki et al. | 357/54 |
| 3,900,350 | 8/1975 | Appels et al. | 357/59 |

Primary Examiner—Stanley D. Miller, Jr.
Assistant Examiner—James W. Davie
Attorney, Agent, or Firm—Hill, Gross, Simpson, Van Santen, Steadman, Chiara & Simpson

[57] ABSTRACT

A semiconductive device is provided which includes a single crystal substrate. A first insulating layer arranged on one surface of the substrate is of polycrystalline silicon containing oxygen. A second insulating layer formed on the first insulating layer is of polycrystalline silicon containing one of a group consisting of nitrogen, $Si_3N_4$, $Al_2O_3$ and silicone resin. The substrate includes at least one PN junction which extends to the said surface of the substrate. A novel method of making is also disclosed.

6 Claims, 18 Drawing Figures

SEMICONDUCTOR DEVICE WITH TWO PASSIVATING LAYERS

BACKGROUND OF THE INVENTION

1. Field of the Invention

This invention relates to a semiconductor device, and more particularly to a semiconductor device provided with a surface passivation layer which is indispensible for the construction of diode and transistors having high reliability.

2. Description of the Prior Art

The surface passivation layer is generally formed by the vapor growth method. Studies have been made on the material of the surface passivation layer in order to make semiconductor elements more passive and more stable. Passivating layers of silicon dioxide $SiO_2$ and $SiO_2$ containing phosphorus, widely used. However, such passivating layer have not sufficient resistant againt moisture. Under moist conditions, leakage currents vary.

A $SiO_2$ layer is coated on the PN junction of the diode which is exposed at the surface of a silicon semiconductor substrate. However, in operation, an undesirable memory function is induced by the positive charge like sodium ion existing in the $SiO_2$ layer. A channel is formed in the P-type semiconductor substrate, due to the negative charge induced by the positive charge in the $SiO_2$ layer.

Accordingly, the $SiO_2$ layer has undesirable characteristics. Moreover, the surface region of Si is apt to be distorted due to the difference between the thermal expansion coefficients of the $SiO_2$ layer and semiconductor substrate.

Silicon nitride ($Si_3N_4$) layer or multiple passivating layers of these materials are also used. These passivating layers have sufficient resistant to moisture, but in this case, these layers can not prevent the effect of polarization which is caused by the positive and negative charges in the outer shielding resin. As a result, the breakdown voltage of the PN junction is lowered, and the reliability is deteriorated by external electric fields.

SUMMARY OF THE INVENTION

An object of this invention is to provide a semiconductor device which has an improved passivating layer for passivation and stabilization.

Another object of this invention is to provide a semiconductor device in which the water-proof characteristics are improved.

In accordance with an aspect of this invention, a first passivating layer of polycrystalline silicon containing oxygen is deposited on a semiconductive single crystal substrate, and a second passivating layer which is selected from the group consisting of a polycrystalline silicon layer containing nitrogen, $Si_3N_4$, $Al_2O_3$ and silicone resin, and this has better water-proof characteristics than a $SiO_2$ layer deposited on the first passivating layer.

In accordance with this invention, the stabilization of the surface of a semiconductor device can be improved. A higher resistance against moisture and higher reliability can be obtained. Since a second passivating layer is used in a semiconductor device according to this invention, the semiconductor device needs not be can-sealed, but can be molded with resin having not as high resistance against moisture.

BRIEF DESCRIPTION OF THE DRAWINGS

This invention will be better understood from the following more detailed description taken in conjunction with the accompanying drawings, in which.

DESCRIPTION OF THE PREFERRED EMBODIMENTS

One embodiment of this invention as applied to a transistor will be described with reference to FIG. 1A to FIG. 8.

First, a method for manufacturing the transistor, will be described with reference to FIGS. 1A to 1G and FIG. 2.

Figure 1A:
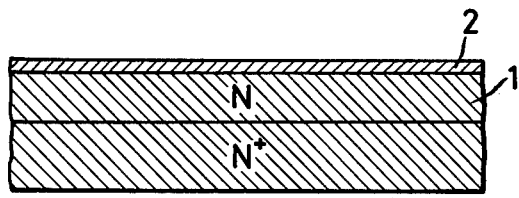
FIGS. 1A to 1G are sectional views showing progressive stages of a method for manufacturing a transistor according to one embodiment of this invention.

As shown on FIG. 1A, an N-type single crystal silicon semiconductor substrate 1 is prepared as a collector region of the transistor. The semiconductor substrate 1 consists of an N-type semiconductive region with a low concentration of impurity of about $10^{15}$ atoms/cm³, which is about 100μ thick, and an N+ -type semiconductive region with a relatively high concentration of impurity, about $10^{20}$ atoms/cm³, which is about 150μ thick. A $SiO_2$ layer 2 as a diffusion mask is formed, to the depth of about 1.0μ, on the semiconductor substrate 1 by a conventional thermal oxidation method.

Figure 1B:
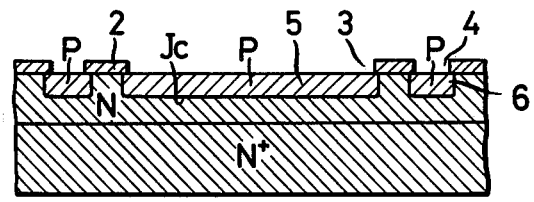
Figure 1C:
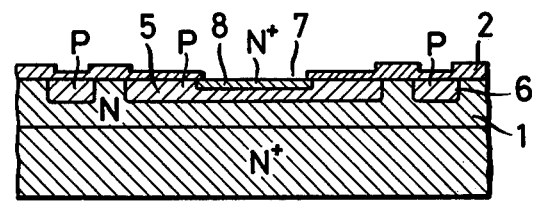

Openings for selective diffusion are formed in the $SiO_2$ layer 2, as shown on FIG. 1B. A first opening 3 for forming a base region is circular or rectangular. A second opening 4 for forming a field limiting ring region or a guard ring region is annular. The field limiting ring region or the guard ring region surrounds the base region. The openings 3 and 4 can be formed by a conventional photo-process using an etching liquid such as hydrofluoric acid. P-type impurities are diffused into the semiconductor substrate 1 through the openings 3 and 4 to simultaneously form a P-type semiconductive region 5 as the base region and a P-type semiconductive region 6 as the guard ring region therein. The diffusion depth or the thickness of the P-type semiconductive regions 5 and 6 is about 20μ. A depletion layer is formed adjacent to a collector junction Jc between the P-type semiconductive region 5 and the semiconductor substrate 1 when a reverse bias voltage is applied to the collector junction Jc. The P-type semiconductive region 6 is so far from the base region 5 that the depletion layer thus formed can extend to the P-type semiconductive region 6 from the collector junction Jc. For example, the P-type semiconductive region 6 is about $100\mu$ distant from the base region 5.

During the diffusion formation of the base region 5 and the P-type semiconductive region 6, $SiO_2$ layers are formed in the openings 3 and 4 by thermal oxidation. As shown on FIG. 1C, an opening 7 for forming an emitter region is formed in the $SiO_2$ layer overlying the base region 5 by a conventional photo-etching method. N-type impurities are diffused into the base region 5 through the opening 7 to form an emitter region 8 to the depth of about $10\mu$ therein. The surface concentration of impurity is about $10^{21}$ atoms/cm$^3$ in the emitter region 8.

Figure 1D:
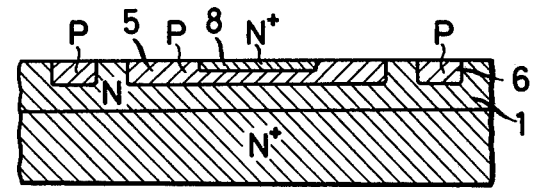

After diffused regions are thus formed in the semiconductor substrate 1 by the diffusion method, the $SiO_2$ layer 2 is removed from the semiconductor substrate 1 by an etching operation, as shown on FIG. 1D. In order to prevent an unnecessary diffusion during the above-mentioned diffusion operations, the lower surface of the semiconductor substrate 1 is covered with a suitable protective film (not shown) such as a wax film.

Figure 1E:
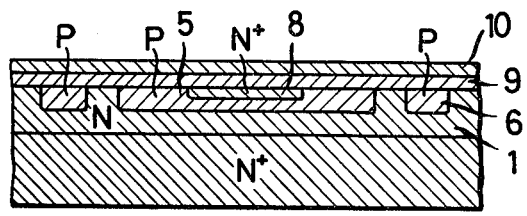
Figure 1F:
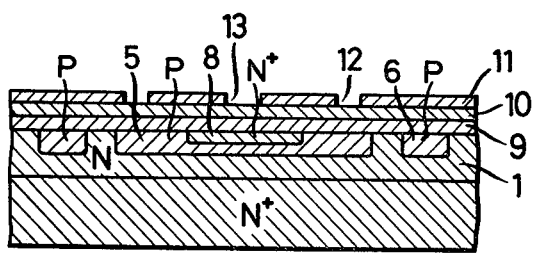

As shown on FIG. 1E, two passivating layers are formed on the main surface of the semiconductor 1. A first passivating layer 9 is a polycrystalline silicon layer containing a predetermined quantity of oxygen atoms. And a second passivating layer 10 is a polycrystalline silicon layer containing a predetermined quantity of nitrogen atoms. Preferable ranges of the thicknesses and of the quantities of oxygen atoms and nitrogen atoms, for the first and second passivating layers 9 and 10 are determined from the results of experiments. For example, the thickness of the first polycrystalline silicon layer 9 is about 5000 A, and the contained quantity of oxygen thereof is about 15 atomic percent. And the thickness of the second polycrystalline silicon layer 10 is about 2000 A, and the contained quantity of nitrogen thereof is about 50 atomic percent. The first and second passivating layers 9 and 10 are successively formed on the semiconductor substrate 1 by an apparatus shown on FIG. 2. The details of the formation will be described below.

Next, a method for forming electrodes in the passivating layers 9 and 10 will be described. A $SiO_2$ layer 11, which is resistant to pyrophosphoric acid as an etching liquid, is formed on the second polycrystalline silicon layer 10, as an etching mask for the second polycrystalline silicon layer 10. Openings 12 and 13 are formed in the $SiO_2$ layer 11 overlying the base region 5 and the emitter region 8, by a conventional photo-etching method, as shown on FIG. 1F. The second polycrystalline silicon layer 10 and successively first polycrystalline silicon layer 9 underlying the openings 12 and 13 are etched by using the $SiO_2$ layer 11 as a mask. Since the first polycrystalline silicon layer 9 can be etched also by a mixed solution of fluoric acid and nitric acid, the etching liquid may be changed in the midst of the etching operation. When the contained quantity of nitrogen atoms is relatively small in the second polycrystalline silicon layer 10, both the second polycrystalline silicon layer 10 and the first polycrystalline silicon layer 9 can be continuously etched with the same mixed solution of fluoric acid and nitric acid. In any case, an etching mask such as the $SiO_2$ layer 11 should not be substantially changed by an etching liquid used for etching the first and second polycrystalline silicon layers 9 and 10. The $SiO_2$ layer 11 used as the etching mask need not be removed after the first and second polycrystalline silicon layers 9 and 10 are etched. Also, such a three-layer construction is preferable. When the three-layer construction consisting of the first polycrystalline silicon layer 9 containing oxygen atoms, the second polycrystalline silicon layer 10 containing nitrogen atoms and the $SiO_2$ layer 11 as third passivating layer covers the exposed parts of the PN-junctions, and electrodes and external leads are arranged over the three-layer construction, a semiconductor device having an improved stability and reliability, and particularly a higher breakdown voltage can be obtained.

Figure 1G:
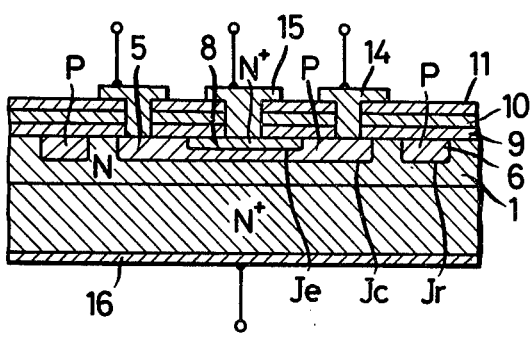
Figure 3:
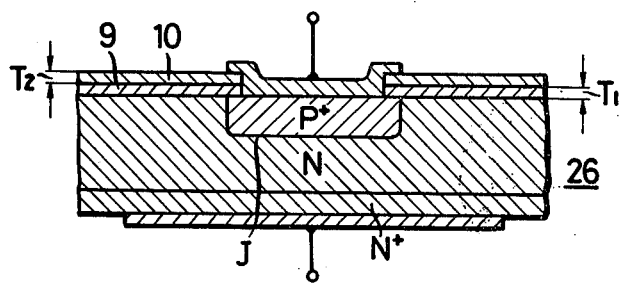
FIG. 3 is a sectional view of a diode according to this invention.

After the first and second polycrystalline silicon layers 9 and 10 are etched through the openings 12 and 13, electrode material such as aluminum is vapor-deposited on the $SiO_2$ layer 11 and the exposed parts of the base region 5 and the emitter region 8. The deposited electrode material is etched to a predetermined pattern to form a base electrode 14 and an emitter electorde 15, as shown on FIG. 1G. Moreover, electrode material is vapor-deposited on the lower surface of the semiconductor substrate 1 to form a collector electrode 16. The semiconductor element of FIG. 1G is mold-sealed or can-sealed. Thus, a transistor device is produced.

Figure 2:
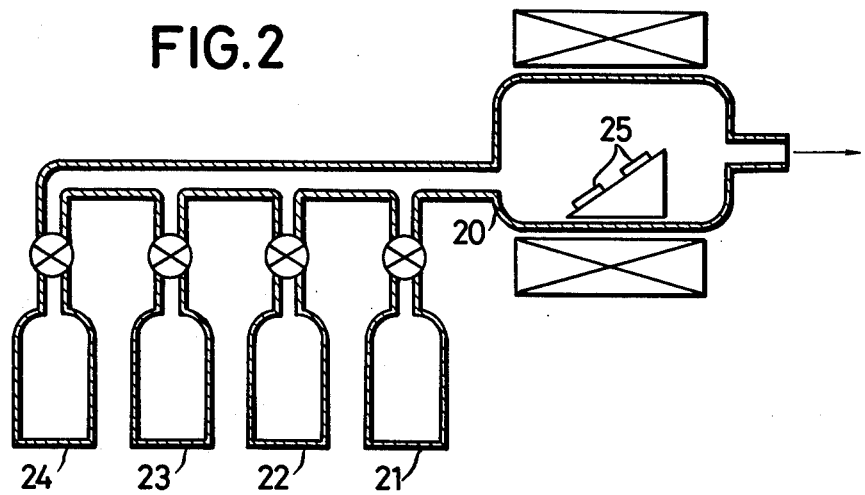
FIG. 2 is a schematic view of an apparatus for manufacturing a semiconductor device according to this invention.

Next, a method for forming the above-mentioned passivating layers on the semiconductor substrate 1 will be described with reference to FIG. 2. The apparatus of FIG. 2 is normally used for a chemical vapor deposition (CVD) method. A furnace 20 of the apparatus is connected to plural tanks 21, 22, 23 and 24 for feeding predetermined gases through suitable valves and flowmeters. The furnace 20 contains semiconductor substrate 25 as shown on FIG. 1D. The semiconductor substrate 25 is heated to a temperature of about 650° C by a heater surrounding the furnace 20. The temperature of about 650° C is for the case where mono-silane $SiH_4$ is used as a supply source of silicon. When another silane gas is used as a supply source of silicon, a heating temperature is determined in consideration of the reaction temperature of the gas. Mono-silane $SiH_4$ from the first tank 21, nitrogen oxide, for example, dinitrogen monoxide $N_2O$ from the second tank 22, ammonia $NH_3$ from the third tank 23, and nitrogen gas $N_2$ as a carrier gas from the fourth tank 24 are fed to the furnace 20, respectively. In this case, an inert gas containing 5 percent of mono-silane $SiH_4$ is fed to the furnace 20 from the tank 21.

Mono-silane $SiH_4$ and dinitrogen monoxide $N_2O$ are fed onto the semiconductor substrate 25 together with the carrier gas for the formation of the first passivating layer 9 shown on FIG. 1E. The concentration of oxygen in the produced polycrystalline silicon layer 9 is determined by the flow ratio of $N_2O$ to $SiH_4$. In this embodiment, the flow ratio of $N_2O$ to $SiH_4$ is about 1/6 and a polycrystalline silicon layer 9 containing about 15 atomic percent of oxygen is formed. Instead of $N_2O$, $NO_2$ or NO may be used to supply oxygen into the polycrystalline silicon layer. The flow rate of $NO_2$ or NO can be easily controlled to obtain the preferable concentration of oxygen.

In order to continuously form the second polycrystalline silicon layer 10 on the first polycrystalline silicon layer 9, ammonia $NH_3$ is fed instead of dinitrogen monoxide $N_2O$.

The second polycrystalline silicon layer 10 is grown at the same temperature of 650° C as the first polycrystalline silicon layer 9. The concentration of the nitrogen atom in the grown polycrystalline silicon layer 10 is determined by the flow ratio of NH$_3$ to SiH$_4$. In this embodiment, the flow ratio of NH$_3$ to SiH$_4$ is about 100/30 for the formation of the second polycrystalline silicon layer 10.

It is preferable that the passivating layers 9 and 10 cover all of the exposed parts of the PN-junctions in the semiconductor substrate 1 of the transistor device as shown on FIG. 1G. As shown in FIG. 1G, all of the exposed parts of the collector jucntion Jc between the collector region 1 and the base region 5, the emitter junction Je between the emitter region 8 and the base region 5, and the auxiliary junction Jr between the collector region 1 and the annular P-type semiconductive region 6 are covered directly with the polycrystalline silicon layer 9 as the first passivating layer. Particularly, it is required that the exposed part of the collector junction Jc, which is reverse-biased in operation, is covered with the polycrystalline silicon layer 9. When the P-type semiconductive region 6 is formed as a guard ring for the transistor having a higher breakdown voltage, as shown on FIG. 1G, the polycrystalline silicon layer 9 is so wide as to cover not only the exposed part of collector junction Jc, but also the extended area of the depletion layer formed when the collector junction Jc is reverse-biased, namely the upper surface of the P-type semiconductive region 6 and the whole area between the collector region 5 and the P-type semiconductive region 6. The exposed part of the emitter jucntion Je may be covered directly with a normal SiO$_2$ layer. However, in that case, the manufacturing steps are increased. The polycrystalline silicon layer 10 as the second passivating layer is at least as wide as to cover the polycrystalline silicon layer 9 as the first passivating layer.

Figure 4:
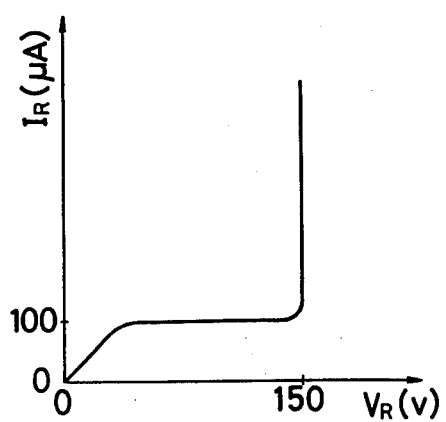
FIG. 4 and FIG. 5 are graphs showing V-I characteristics of the diode of FIG. 3 in which the thickness of the passivating layer varies for comparison.
Figure 5:
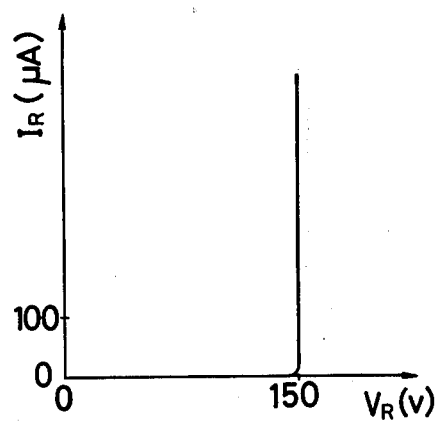
Figure 6:
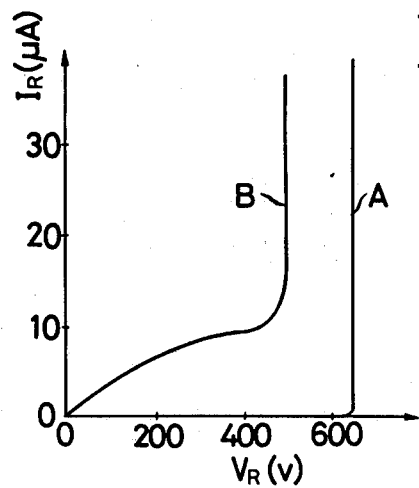
FIG. 6, FIG. 7, and FIG. 8 are graphs showing V-I characteristics of a conventional semiconductor device, a semiconductor device disclosed in U.S. application, Ser. No. 561,532, filed Mar. 24, 1975, now U.S. Pat. No. 4,014,037, and filed by this assignee, and a semiconductor device according to this invention.
Figure 7:
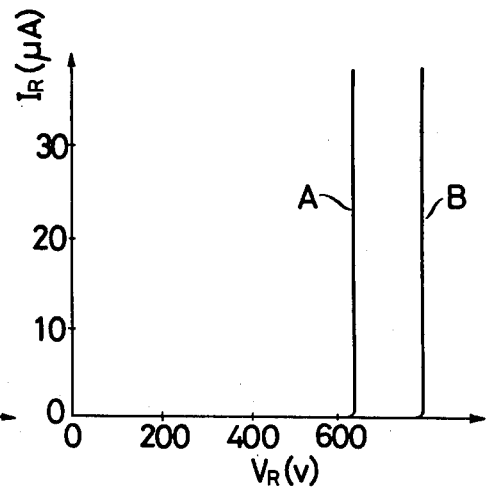
Figure 8:
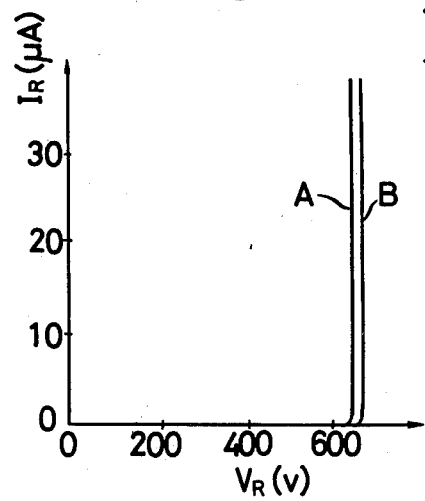

The thickness T$_1$ of the polycrystalline silicon layer 9 is preferably in the range of $0.1\mu \leq T_1 \mu\ 2.0\mu$. It is proved that the reverse current characteristic after heat treatment is deteriorated when the thickness T$_1$ is smaller than 0.1$\mu$. Two kinds of PN diodes 26 different in the thickness T$_1$ were prepared as shown on FIG. 3. The polycrystalline silicon layers 9 and 10 covered the exposed parts of PN-junctions J in the PN diode 26. The thickness T$_1$ of the first polycrystalline silicon layer 9 of one PN diode was 500 A. The thickness T$_1$ of the first polycrystalline silicon layer 9 of the other PN diode was 5000 A (=0.5$\mu$). The PN diodes were tested after heat treatment at a temperature of 1100° C for about 10 minutes in an atmosphere of dry nitrogen gas. The results of the tests are shown on FIG. 4 and FIG. 5. FIG. 4 shows the reverse current characteristics of the diode having the thickness T$_1$ of 500 A. As shown on FIG. 4, the breakdown voltage was about 150V, but a saturation reverse current of about 100$\mu$A flows under the breakdown voltage. FIG. 5 shows the reverse current characteristics of the other diode having the thickness T$_1$ of 5000 A. As shown on FIG. 5, the breakdown voltage is about 150 V and a saturation reverse current scarcely flows under the breakdown voltage. Thus, a good reverse V-1 characteristic is obtained for the PN diode having the thickness T$_1$ of 5000 A. Since the electode cannot be satisfactorily formed for too thick a polycrystalline silicon layer 9, it is preferable that the thickness T$_1$ of the polycrystalline silicon layer 9 be under 2.0$\mu$.

It is preferable that the grain size of the polycrystalline silicon be under 1000 A, for example, in the range of about 100 to 200 A. When the grain size is too large, electrons are trapped and stored in the polycrystalline silicon layer, so that a memory phenomenon is encountered and a sufficient stabilization cannot be obtained. The optimum deposition temperature for the formation of the polycrystalline silicon layer containing oxygen and silicon crystals having the preferable grain sizes is in the range of 600° to 750° C.

It is preferable that the polycrystalline silicon layer 9 contain about 2 to 45 atomic percent of oxygen. The good results can be obtained for the polycrystalline silicon layer containing oxygen at such concentrations, in comparison with a conventional SiO$_2$ layer as a passivating layer. 10 to 30 Atomic percent of oxygen is desirable for obtaining a remarkable effect. And 13 to 20 atomic percent of oxygen is more desirable. When the polycrystalline silicon layer 9 contains a too small quantity of oxygen, reverse leakage currents flow. When the polycrystalline silicon layer 9 contains a too large quantity of oxygen, the polycrystalline silicon layer 9 is nearly similar to the SiO$_2$ layer.

It is disclosed in the U.S. application, Ser. No. 561,532, filed Mar. 24, 1975, now U.S. Pat. No. 4,014,037, and assigned to the same assignee, that the polycrystalline silicon layer containing oxygen covers the exposed part of the PN junction in the semiconductor substrate. However, the semiconductor device disclosed in the said application does not have a satisfactory resistivity to moisture. It has been found that a good reverse V-I characteristic can be obtained when a second passivating layer according to this invention is formed on a first passivating layer.

Three types of diodes were prepared for comparison tests of resistivity against moisture. The results of the comparison tests are shown on FIG. 6, FIG. 7 and FIG. 8.

1. A SiO$_2$ layer is thermally formed, to the thickness of about 1.0$\mu$, on the exposed part of the first diode. The results of the test are shown on FIG. 6. 2. A polycrystalline silicon layer containing 15 atomic percent of oxygen covers are exposed part of the PN junction of the second diode. Moreover, a SiO$_2$ layer is deposited, to the thickness of about 1.0$\mu$, on the polycrystalline silicon layer at the temperature of 48° C by the CVD method. The results of the test are shown on FIG. 7. 3. According to this invention, the first polycrystalline silicon layer containing oxygen covers the exposed part of the PN junction of the third diode. Moreover, the second polycrystalline silicon layer containing nitrogen is deposited on the first polycrystalline silicon layer. The third diode thus formed is the same as the diode shown on FIG. 3. The results of the test are shown on FIG. 8.

The diodes were exposed to water vapor of 100° C for over 15 minutes, respectively. The V-I characteristics of the diodes were measured before the exposure to water vapor (A) and after the exposure to water vapor (B). As shown on FIG. 6, a reverse current of over 10$\mu$A flowed in the first diode which had been exposed to water vapor for 15 minutes. As shown on FIG. 7, a V-I characteristic curve shifted by about 150 V for the second diode which had been exposed to water vapor for about 30 minutes. Although a breakdown voltage of the second diode increased after exposure to water vapor, the shift amount was not constant. Such shift is not desirable from the viewpoint of stability and reliability. As shown on FIG. 8, a V-I characteristic curve of the third diode according to this invention was nearly unchanged after the exposure to water vapor for 2 hours. The practical use condition of a semiconductor device is not so severe as the above-described test conditions for the diodes. It is proved by the above-described comparison tests that the semiconductor element according to this invention has a higher resisitivity against moisture.

The polycrystalline silicon layer 10 as the second passivating layer is formed by the apparatus shown on FIG. 2. Namely, it is normally formed from mono-silane $SiH_4$ and ammonia $NH_2$ by the CVD method. There are preferable ranges of thickness $T_2$ and nitrogen content also for the polycrystalline silicon layer 10. It is required that the thickness $T_2$ of the polycrystalline silicon layer 10 is over 1000 A, in order to obtain a sufficient resistivity against moisture and to prevent pin-holes from occurring in the polycrystalline silicon layer 10. It is preferable that the added thickness $T_1 + T_2$ of the two polycrystalline silicon layers 9 and 10 be under $2\mu$, since there is the possibility that electrodes cannot be successfully formed on the etched polycrystalline silicon layers 9 and 10 having a thickness $T_1 + T_2$ of over $2\mu$. And it is necessary that the polycrystalline silicon layer 10 contain over 10 atomic percent of nitrogen. Under 10 atomic percent of nitrogen, dielectric breakdown often occurs on the surface of the polycrystalline silicon layer 10. When a high voltage is applied across a base electrode and a collector electrode arranged adjacent to each other on the polycrystalline silicon layer 10 containing under 10 atomic percent of nitrogen, there is the possibility that the base electrode and the collector electrode will be short-circuited and so discharging occurs through the surface of the polycrystalline silicon layer 10. The property of the polycrystalline silicon containing a too small a quantity of nitrogen is nearly similar to that of a pure polycrystalline silicon which has not sufficient resistivity against water. The polycrystalline silicon may contain a too large quantity of nitrogen. Even the polycrystalline silicon containing nitrogen at a concentration nearly similar to $Si_3N_4$ has sufficient resistivity against water. An optimum heating temperature for the formation of the polycrystalline silicon layer containing nitrogen is in the range of 600° to 800° C. It is practically permissible that the heating temperature be nearly the same as the heating temperature for the formation of the polycrystalline silicon layer containing oxygen.

A $Si_3N_4$ layer may be formed instead of the polycrystalline silicon layer containing nitrogen as the second passivating layer. A heating temperature for the formation of the pure $Si_3N_4$ layer is set somewhat higher than the heating temperature for the formation of the polycrystalline silicon layer containing nitrogen.

Next, another embodiment of this invention will be described with reference to FIG. 9. This embodiment involves a MOS-FET.

Figure 9:
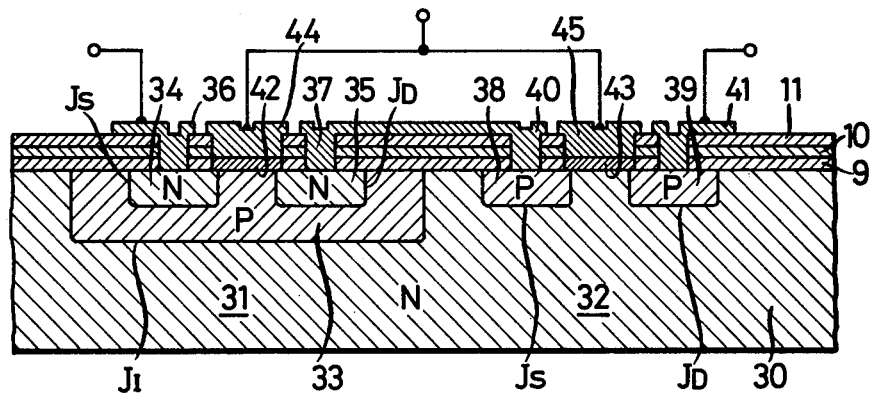
FIG. 9 is a sectional view of a complementary type MOS-FET according to another embodiment of this invention.

As shown on FIG. 9, an N-channel type MOS-FET 31 and a P-channel type MOS-FET 32 are formed in a common N-type silicon semiconductor substrate 30. An island-like P-type semiconductive region 33 is formed in the N-channel type MOS-FET 31. Moreover, an N-type source region 34 and an N-type drain region 35 are formed in the P-type semiconductive region 33. A source electrode 36 and a drain electrode 37, of metallic material such as aluminum, are deposited on the source region 34 and the drain region 35, respectively. On the other hand, a P-type source region 38 and a P-type drain region 39 are formed in the P-channel type MOS-FET 32. A source electrode 40 and a drain electrode 41 of metallic material such as aluminum, are deposited on the source region 38 and the drain region 39, respectively. Gate insulating layers 42 and 43 of silicon oxide $SiO_2$ cover areas between the source region 34 and the drain region 35, and between the source region 38 and the drain region 39, respectively. And gate electrodes 44 and 45 are formed on the gate insulating layers 43 and 43, respectively. The polycrystalline silicon layer 9 as the first passivating layer, containing a predetermined quantity of oxygen atoms and having a predetermined thickness, is deposited on the main surface of the smiconductor substrate 30. And the polycrystalline silicon layer 10 as the second passivating layer, containing a predetermined quantity of nitrogen atoms and having a perdetermined thickness, is deposited on the polycrystalline silicon layer 9. The polycrystalline silicon layers 9 and 10 are similar to those of the above described first embodiment. The polycrystalline silicon layer 9 as the first passivating layer covers the exposed part of a PN junction $J_I$ between the P-type semiconductive region 33 and the semiconductor substrate 30 in the N-channel type FET 31 and the exposed parts of source junctions $J_S$ defining the source region 34 and 38, and drain junctions $J_D$ defining the drain regions 35 and 39 except those of the junctions $J_S$ and $J_D$ formed in the gate regions. The polycrystalline silicon layer 10 as the second passivating layer perfectly covers the polycrystalline silicon layer 9. The $SiO_2$ layer 11 as the etching mask formed on the two polycrystalline silicon layers 9 and 10 need not be removed in the same manner as the transistor of FIG. 1G. When the electode 37 extends over the insulating layer as in this embodiment, it is preferable that the uppermost layer be a $SiO_2$ layer. Because electric characteristics between the electrode 37 and the other electrodes, and between the electrode 37 and the semiconductor substrate 30 become extremely reliable.

In the two FETs according to this embodiment, the drain region 35 of the one FET 31 is electrically connected to the source region 38 of the other FET 32, and moreover the gate electrodes 44 and 45 are electrically connected to each other. Thus, a so-called complementary type MOS-FET is formed as an inverter circuit. Since the first polycrystalline silicon layer 9 covers the exposed part of the PN junction $J_I$ between the P-type semiconductive region 33 and the N-type semiconductive region 30, and an intermediate area between the FETs 31 and 32, it is possible to prevent an undesirable channel due to an inversion layer on the surface of the semiconductor substrate. There is the possibility in a conventional complementary type MOS-FET that an undesirable channel due to the inversion layer occurs. In order to prevent the undesirable channel, a diffusion region or a so-called channel stopper is formed in the intermediate region between the FETs of the conventional complementary type MOS-FET. Such a region or stopper is not required for the MOS-FET according to this invention. Accordingly, integration density can be improved in the semiconductor device according to this invention. When the two polycrystalline silicon layers according to this invention are used for the complementary type MOS-FET, not only a higher resistivity against moisture, but also the above-described desirable effects can be obtained.

Next, a method for manufacturing the MOS-FET according to this embodiment will be described.

By using a SiO$_2$ layer (not shown) as a diffusion mask, the P-type semiconductive region 33, the source region 38 and drain region 39 of the P-channel type FET 32 and the source region 34 and drain region 35 of the N-channel type FET 31 are sequentially formed in the semiconductor substrate 30 by a conventional diffusion method. The SiO$_2$ layer (not shown) then is removed from the semiconductor substrate 30. Thereafter, the first polycrystalline silicon layer 9 is formed on the semiconductor substrate 30, and the second polycrystalline silicon layer 10 is sequentially formed on the first polycrystalline silicon layer 9, by the above-described CVD method. Openings are made in the polycrystalline silicon layers 9 and 10 overlying the gate regions. The thin insulating gate layers 42 and 43 are formed in the openings by the thermal oxidation method in which the semiconductor element is treated at a high temperature such as 1100° C. In that case, the thickness of the passivating layers should be considered, which has been discussed above with reference to FIG. 4 and FIG. 5. Then, openings are made in the polycrystalline silicon layers, and the source electrodes, the drain electrodes and the gate electrodes are formed in the openings.

Figure 10:
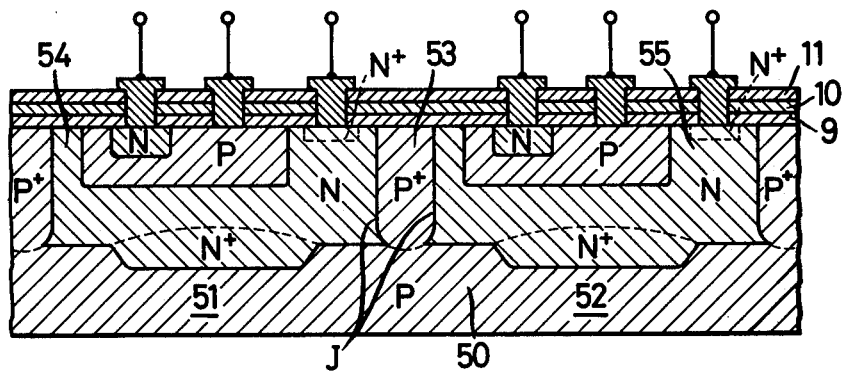
FIG. 10 is a sectional view of bipolar transistors according to a further embodiment of this invention.

Next, a further embodiment of this invention will be described with reference to FIG. 10. The embodiment is applied to a bipolar integrated circuit.

NPN-type transistors 51 and 52 are formed in a P-type silicon semiconductor substrate 50, as in a conventional integrated circuit. By the above-described method, the polycrystalline silicon layer 9 as the first passivating layer, containing a predetermined quantity of oxygen atoms and having a predetermined thickness is deposited on the main surface of the semiconductor substrate 50, the polycrystalline silicon layer 10 as the second passivating layer, containing a predetermined quantity of nitrogen atoms and having a predetermined thickness is deposited on the polycrystalline silicon layer 9, and moreover the SiO$_2$ layer 11 is deposited on the polycrystalline silicon layer 10. The polycrystalline silicon layers 9 and 10 cover the exposed parts of PN-junctions J formed by P-type semiconductive regions 53 for separation of semiconductor elements and island-like N-type semiconductive regions 54 and 55. The PN junctions J are reverse-biased in the operation of the semiconductor elements. The polycrystalline silicon layers 9 and 10 cover also the exposed parts of collector junctions and emitter junctions, as in the transistor of FIG. 1G.

It is required in all of the semiconductor devices of FIG. 1G, FIG. 3, FIG. 9 and FIG. 10 that the polycrystalline silicon layer 9 as the first passivating layer covers at least the exposed part of the reverse-biased one of the PN-junctions formed in the single crystal semiconductor substrate, and the polycrystalline silicon layer 10 as the second passivating layer covers almost the whole surface of the polycrystalline silicon layer 9 as the first passivating layer. The two polycrystalline silicon layers 9 and 10 cover the whole of the main surface of the semiconductor substrate except the portions on which the metal electrodes are deposited, when the semiconductor elements of the above-described embodiments are looked at from above.

Although there have been described the semiconductor devices of planar structure in which the ends of the PN-junctions are exposed on the main surface of the semiconductor substrate, this invention may be applied to mesa-type semiconductor devices.

Figure 12:
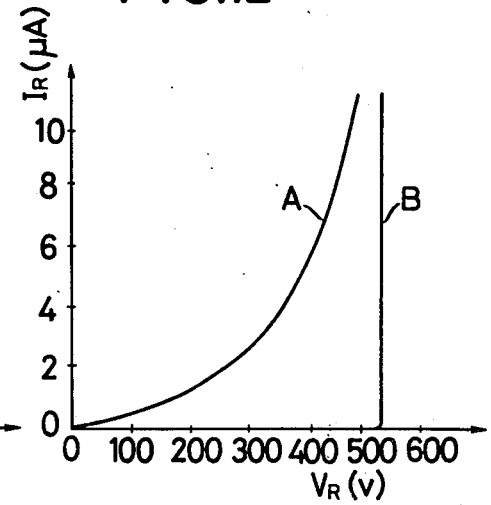
FIG. 12 is a graph showing V-I characteristics of the diode of FIG. 11.
Figure 11:
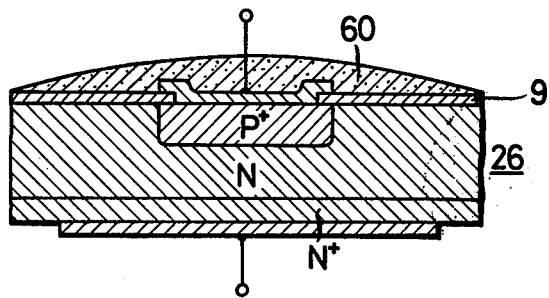
FIG. 11 is a sectional view of a modification of a diode according to this invention.

Instead of the polycrystalline silicon layer 10 as the second passivating layer, containing nitrogen, any other material which has better water-proof characteristics than SiO$_2$, for example, alumina, silicone resin or epoxy resin may be used in the above described embodiments. For example, as shown on FIG. 11, a silicone resin layer 60 is coated on the first polycrystalline silicon layer 9, instead of the second polycrystalline silicon layer 10 in the diode 26 of FIG. 3. Since the silicone resin layer 60 functions as a stable insulating layer, the breakdown voltage of the diode after coated is much higher than that of the diode before coated. In FIG. 12, a curve A shows the V - I characteristic of the diode before coated, and a curve B the V - I characteristic of the diode after coated. Moreover, the diode after coated exhibited good characteristics also in a reliability test (120° C, 700 VDC).

In the manufacturing method, the openings may be made in the polycrystalline silicon layers by a plasma-etching method in which a resist mask is coated on the polycrystalline silicon layers. The SiO$_2$ needs not always be epitaxially grown on the polycrystalline silicon layers, as the mask. By the plasma-etching method, a stable passivating layer can be obtained at a lower cost.

It will be apparent to those skilled in the art that many modifications and variations may be effected without departing from the spirit and scope of the novel concepts of the present invention.

We claim as our invention

1. A semiconductive device comprising a semiconductive single crystal substrate; a first passivating layer of polycrystalline silicon containing oxygen in the range between 2 and 45 atomic percent on and having a first surface in substantial electrical contact with a first surface of said substrate, a second passivating layer which is selected from the group consisting of polycrystalline silicon containing nitrogen, Si$_3$N$_4$, Al$_2$O$_3$ and silicone resin on and having a first surface in contact with a second surface of said first passivating layer and said first and second surfaces of said first passivating layer being substantially parallel.

2. A semiconductive device according to claim 1, wherein at least one junction is formed in said semiconductive single crystal substrate and said junction is reverse biased during operation.

3. A semiconductive device according to claim 2, wherein said first passivating layer and said second passivating layer are formed so as to cover a depletion layer extending from said junction.

4. A semiconductive device comprising an emitter region; a base region; a collector region; and forming a junction between said base region and collector region; and a first passivating layer of polycrystalline silicon containing oxygen in the range of between 2 to 45 atomic percent having a first surface on and in substantial electrical contact with the exposed portion of said junction and a second passivating layer which is selected from the group consisting of polycrystalline silicon containing nitrogen, Si$_3$N$_4$, Al$_2$O$_3$ and silicone resin on a second surface of said first passivating layer.

5. A semiconductive device comprising a semiconductive single crystal substrate; a first passivating layer of polycrystalline silicon containing oxygen in the range of 2 to 45 atomic percent on and having a first surface in substantial contact with a first surface of said substrate, a second passivating layer of polycrystalline silicon containing nitrogen of more than 10 atomic percent on and having a first surface in contact with a second surface of said first passivating layer and said first and second surfaces of said first passivating layer being substantially parallel.

6. A semiconductive device comprising a semiconductive single crystal substrate, a first passivating layer of polycrystalline silicon containing oxygen in the range of 2 to 45 atomic percent on and having a first surface in substantial electrical contact with a first surface of said substrate, a second passivating layer of polycrystalline silicon containing nitrogen of more than 10 atomic percent formed on and having a first surface in contact with a second surface of said first passivating layer, said first and second surfaces of said first passivating layer being substantially parallel and a silicon dioxide layer on and having a first surface in contact with a second surface of said second passivating layer, said first and second surfaces of said second passivating layer being substantially parallel.

* * * * *